(12) United States Patent
Kumagai

(10) Patent No.: US 9,390,843 B2
(45) Date of Patent: Jul. 12, 2016

(54) INPUT CIRCUIT INCLUDES A CONSTANT CURRENT CIRCUIT

(71) Applicant: FUJI ELECTRIC CO., LTD., Kawasaki-shi (JP)

(72) Inventor: Naoki Kumagai, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/499,740

(22) Filed: Sep. 29, 2014

(65) Prior Publication Data

US 2015/0115928 A1 Apr. 30, 2015

(30) Foreign Application Priority Data

Oct. 28, 2013 (JP) ................. 2013-223318

(51) Int. Cl.
*G05F 1/613* (2006.01)
*H01C 1/16* (2006.01)
*H02H 9/04* (2006.01)

(52) U.S. Cl.
CPC ........ *H01C 1/16* (2013.01); *G05F 1/613* (2013.01); *H02H 9/04* (2013.01); *H03F 2203/45552* (2013.01)

(58) Field of Classification Search
CPC .............. G05F 1/56; G05F 5/00; H02H 9/02; H02H 9/04; H01C 1/16
USPC ............................. 323/271–281; 327/538–543
See application file for complete search history.

(56) References Cited

U.S. PATENT DOCUMENTS

| 4,503,480 | A | * | 3/1985 | Pickard et al. | ................. 361/152 |
| 4,845,420 | A | * | 7/1989 | Oshizawa et al. | ............. 323/222 |
| 6,377,113 | B1 | * | 4/2002 | Kanno | .......................... 327/543 |
| 6,381,114 | B1 | * | 4/2002 | Mansfield | ....................... 361/58 |
| 7,848,151 | B2 | * | 12/2010 | Chan et al. | ............... 365/185.23 |
| 8,786,357 | B1 | * | 7/2014 | Wright | .......................... 327/538 |

FOREIGN PATENT DOCUMENTS

JP 2011-120474 A 6/2011

* cited by examiner

*Primary Examiner* — Timothy J Dole
*Assistant Examiner* — Htet Z Kyaw
(74) *Attorney, Agent, or Firm* — Rossi, Kimms & McDowell LLP

(57) ABSTRACT

In aspects of the invention, a zap circuit and a decoder for decoding the output of the zap circuit turn ON only one analog switch in a selector. The selector delivers an electric potential at a node of a dividing resistor selected by the zap circuit. The output of the selector is delivered to the non-inverting input of an operational amplifier, and the output of the operational amplifier is delivered to the gate terminal of a MOSFET. The operational amplifier controls the gate of the MOSFET so that the potential at a current detecting resistor equals the output of the selector. As a result, a current proportional to the input voltage flows through the MOSFET. Because the current through a dividing resistor is also proportional to the input voltage, the total current is eventually proportional to the input voltage.

8 Claims, 4 Drawing Sheets

US 9,390,843 B2

INPUT CIRCUIT INCLUDES A CONSTANT CURRENT CIRCUIT

CROSS-REFERENCE TO RELATED APPLICATION

This application is based on, and claims priority to, Japanese Patent Application No. 2013-223318, filed on Oct. 28, 2013, the contents of which are incorporated herein by reference.

BACKGROUND OF THE INVENTION

1. Field of the Invention

Aspects of the invention are related to input circuits that reduce dispersion of input resistances to settle to a specified value.

2. Description of the Related Art

FIG. 7 shows a connection construction example of a conventional igniter. Referring to FIG. 7, a signal is given from an electric control unit (ECU) 1 through a connector 2 to an igniter 3. An insulated gate bipolar transistor (IGBT) 7 installed in the igniter 3 conducts ON/OFF operation of the primary current through a coil 4 to generate a voltage at several tens of kilovolts across the secondary winding of the coil 4. This voltage generates a discharge between both sides of a gap 5 of a spark plug to ignite engine fuel. The ECU 1 in FIG. 7 can detect the current Iin through the signal line in order to avoid ignition failure due to poor contact at the connector 2.

Japanese Unexamined Patent Application Publication No. 201 1-1 20474 (also referred to herein as "Patent Document 1") discloses a circuit for supplying power to an intrinsically safe load. The circuit comprises a power source, output terminals connecting to the intrinsically safe load, a voltage limiting circuit between the power source and the output terminals, and a current limiting circuit that converts a current to a voltage for comparison in an operational amplifier and includes a barrier resistor for limiting the current to the load. The voltage limiting circuit limits the voltage across the load, and the current limiting circuit includes an instantaneous current limiting circuit to limit an instantaneous current to the load. The voltage limiting circuit and the current limiting circuit supply electric power to the load.

The ECU 1 shown in FIG. 7 needs to detect a slight variation in current for detecting precursory phenomena of poor contact at the connector 2. Thus, the input resistor 6 of the igniter 3 needs to have an accurate value. Because an accuracy that is attained through a usual semiconductor process is insufficient for the input resistor 6, the accuracy of the input resistor is generally achieved by composing the input resistor using a discrete component and by mounting the input resistor on a ceramic substrate (not shown in the figure).

Thus, in conventional igniters, the power device such as an IGBT is mounted on a copper frame (not shown) exhibiting good heat dissipation, and a discrete component and integrated circuit (IC) for control are mounted on a ceramic substrate, which is expensive.

To detect a feeble contact resistance, the input resistor 6 is set at a relatively small resistance value. As a consequence, if input terminals are short-circuited with the power source such as a battery due to misconnection at the connector 2 or interconnection caused by foreign matter in contact with the terminals, a heavy current flows that may cause inflammation which is a serious accident for a vehicle.

Patent Document 1 does not describe a function virtually equivalent to a current limiting resistor performed by controlling a constant current source with an input voltage.

SUMMARY OF THE INVENTION

Embodiments of the present invention have been made in view of the problems described above, as well as in view of other problems in the art, and embodiments of the invention provide an input circuit that achieves input performance virtually equivalent to a high accuracy resistor using a semiconductor device such as a control IC and that limits the input current in an event of abnormal power source to avoid inflammation.

In some embodiments, an input circuit of the invention includes an input voltage detecting circuit and a means for supplying a current proportional to the input voltage. By correcting a coefficient of proportionality for reflecting the detected voltage to a current value, a virtually high accuracy input resistance is achieved using a semiconductor circuitry. In addition, when an input voltage higher than a specified value is applied, the current is limited to restrict heating, thereby avoiding inflammation.

In view of the difficulty in producing a high accuracy input resistor by means of semiconductor processing, embodiments of the invention form a virtually high accuracy resistor on an IC mounted on a frame by correcting the resistance value in combination with a zap circuit. It is therefore not necessary, in some embodiments, to use discrete components for achieving high accuracy of the input resistor and to mount the components on an expensive ceramic substrate.

Because, in some embodiments, a current limiting function is also performed by one and the same circuit, the input circuit of the invention protects the circuit components and devices used in the input circuit in the event of power source abnormality, for example power source short-circuit, at the input terminal.

DETAILED DESCRIPTION OF THE INVENTION

Some embodiments of the present invention will be described in detail in the following with reference to accompanying drawings.

[Embodiment Example 1]

Figure 1:
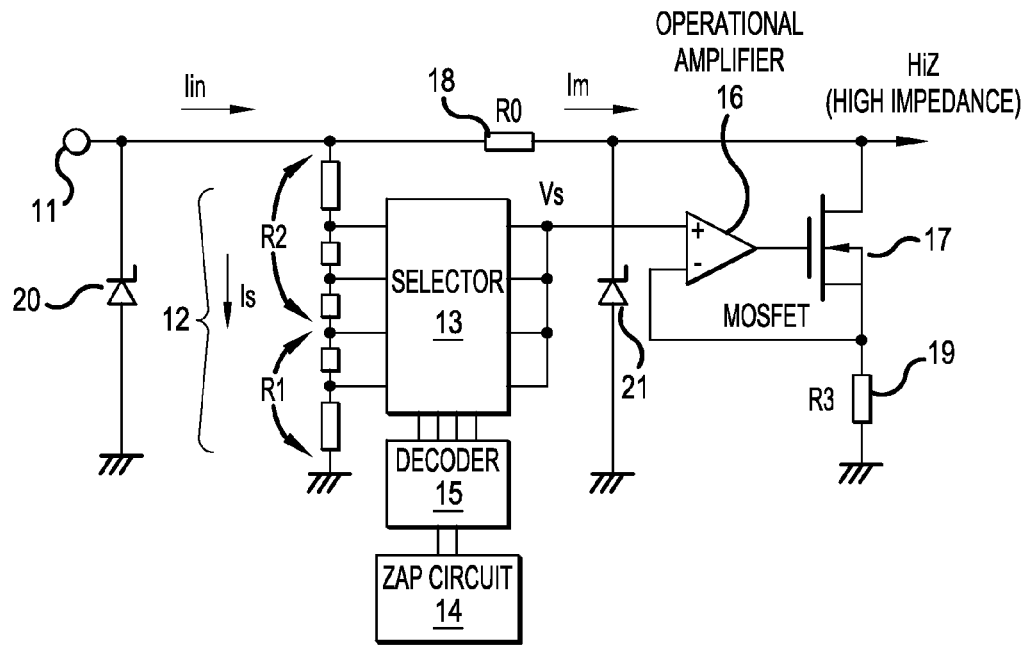
FIG. 1 shows a construction of an input circuit according to Embodiment Example 1 of the present invention.

FIG. 1 shows a construction of an input circuit according to Embodiment Example 1 of the invention. Referring to FIG. 1, a dividing resistor 12 is connected to an input terminal 11.

Some of the nodes in the dividing resistor 12 are connected to a selector 13 composed of a row of analog switches. A zap circuit 14 and a decoder 15 that decodes the output from the zap circuit 14 turn ON only one of the analog switches in the selector 13, which in turn delivers an electric potential Vs at the node of the dividing resistor selected by the zap circuit 14.

In place of the construction described above, an output from the zap circuit 14 can be directly delivered to the selector 13, although such a construction may exhibits a degraded efficiency in the case of a large number of selections. The zap circuit 14 can be replaced by an electrically erasable programmable read-only memory (EEPROM). Because the dividing resistor 12 can be set at a relatively high resistance value, a part of the dividing resistor 12 can be short-circuited with a Zener for zapping if the resistance is sufficiently higher than the Zener resistance after zapping. However, as in the case of directly driving the selector 13 by the zap circuit 14, a degraded efficiency results in the case of a large number of selections.

The output from the selector 13 is delivered to a non-inverting input terminal (or "+" terminal) of an operational amplifier 16, and an output from the operational amplifier 16 is given to the gate of a metal oxide semiconductor field effect transistor (MOSFET) 17. An inverting input terminal (or "−" terminal) of the operational amplifier 16 is connected to the source of the MOSFET 17. The drain of the MOSFET 17 is connected to an internal resistance with a high impedance as indicated "HiZ", such as a comparator input in a normal condition, and is also connected through a surge protecting resistor (R0) 18 to the input terminal 11. The source of the MOSFET 17 is connected through a current detecting resistor (R3) 19 to the ground potential, a base potential. The MOSFET 17 can be composed not only of a silicon semiconductor but also of a wide band-gap semiconductor such as SiC, GaN, or diamond.

Because the operational amplifier 16 controls the gate of the MOSFET 17 so that the output of the selector 13 is equal to the electric potential at a current detecting resistor (R3) 19, the MOSFET 17 carries a current proportional to the input voltage. Because the current through the dividing resistor 12 is also proportional to the input voltage, the total current is proportional to the input voltage. Therefore, the circuit configuration as seen from outside is virtually equivalent to connecting a constant input resistor.

A surge absorbing Zener diode 20 connected between the input side of a surge protecting resistor (R0) 18 and the ground potential, the base potential, and a surge absorbing Zener diode 21 connected between the output side of the surge protecting resistor (R0) 18 and the ground potential protect the MOSFET 17 and internal circuits connected to the drain of the MOSFET 17 in an event in which the input terminal 11 is subjected to an extremely high surge voltage such as an electrostatic discharge (ESD). This protecting action does not affect the basic performance of the input circuit described above as long as the resistance value of the surge protecting resistor (R0) 18 is not very large.

An equivalent resistance of the input circuit can be obtained as follows. A current Is flowing through the dividing resistor 12 and an output voltage Vs of the selector 13 are represented by the following formulas (1) and (2).

$$Is = Vin/(R1+R2) \quad (1)$$

$$Vs = Is\, R1 = Im\, R3 \quad (2)$$

Where Vin is an input voltage, R1 is a resistance between the node of the dividing resistor selected in the selector 13 and the ground potential, R2 is a resistance between the node of the dividing resistor selected in the selector 13 and the input terminal 11, R0 is a resistance of the surge protecting resistor (R0) 18, R3 is a resistance of the current detecting resistor (R3) 19, and Im is a current flowing through the current detecting resistor (R3) 19. The input resistance seen from the input terminal 11 is $$Rin = Vin/(Is+Im) = (R1+R2)/(1+R1/R3) \quad (3)$$

Thus, a desired input resistance Rin can be obtained by appropriately selecting the resistance values of R1, R2, and R3.

It is difficult to attain high accuracy in forming the dividing resistor 12 and the current detecting resistor (R3) 19 by means of semiconductor processing. However, if a measured input resistance value is different from a desired value, correction can be performed by selecting an output of the selector 13 from a potential at an appropriate node of the dividing resistor 12 with the aid of the zap circuit 14.

It is desired for the dividing resistor 12 and the current detecting resistor (R3) 19 not to exhibit temperature dependence. Such a temperature-independent resistance is known to be obtained, for example, with poly-silicon having a thickness of about 0.5 μm after boron ion implantation at a dose of $3 \times 10^5/cm^2$. Fortunately, this dose amount can be shared with the one in the ion implantation for forming the source region and the drain region of a p-channel MOSFET.

The dividing resistor 12, which can have a relatively high resistance value, generates small energy loss. Thus, even though a poly-silicon resistor formed on an oxide film exhibiting poor heat dissipation can be favorably employed in this application field. On the other hand, the surge protecting resistor (R0) 18 can have scattering and temperature dependence of the resistance value as long as the sum of the resistance values of the surge protecting resistor (R0) 18, the current detecting resistor (R3) 19, and the ON-resistance of the MOSFET 17 when the maximum output voltage of the operational amplifier 16 given to the gate of the MOSFET 17 is not larger than a desired resistance value in consideration of temperature dependence of the resistances.

Figure 2:
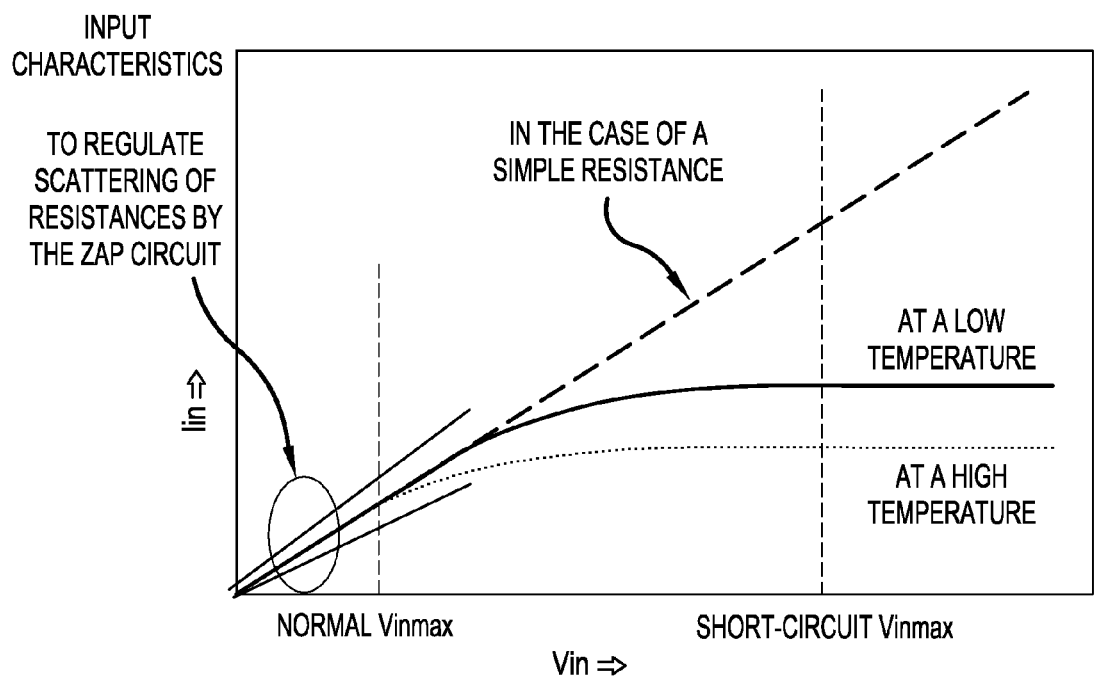
FIG. 2 shows a relationship between input voltage and input current in the input circuit according to Embodiment Example 1 of the present invention.

FIG. 2 shows a relationship between input voltage Vin and input current Iin in the input circuit according to Embodiment Example 1 of the present invention. A current proportional to the input voltage Vin flows within the normal input voltage range, which is usually not larger than 5 V depending on the output voltage of the ECU, though. Over the voltage range, a saturating tendency can be seen. Because a voltage larger than the maximum output of the operational amplifier 16 cannot be given to the gate of the MOSFET 17, the saturation characteristic of the MOSFET is observed around the maximum output of the operational amplifier 16.

This saturation characteristic is rather favorable because it restricts the current value in the abnormal event of short-circuit of power source at the input terminal, suppressing overheating. The source-gate voltage of the MOSFET 17 can be decreased by decreasing the ratio of gate width W to gate length L or increasing the output voltage Vs of the selector 13 to reduce the saturation current. The saturation characteristic of the MOSFET 17 exhibits such a temperature dependence that the saturation current decreases at high temperatures in the region of relatively high gate voltage. Consequently, the parameters need to be adjusted in consideration of the temperature dependence of the MOSFET 17 so that the linearity between the input voltage Vin and the input current Iin is ensured in a specified temperature range and in a normal input voltage range.

When the node of the dividing resistor 12 is connected not through the selector 13 but directly to the non-inverting terminal ("+" terminal) of the operational amplifier 16, the input circuit does not serve a function of resistance correction and only serves a function of current limitation.

[Embodiment Example 2]

Figure 3:
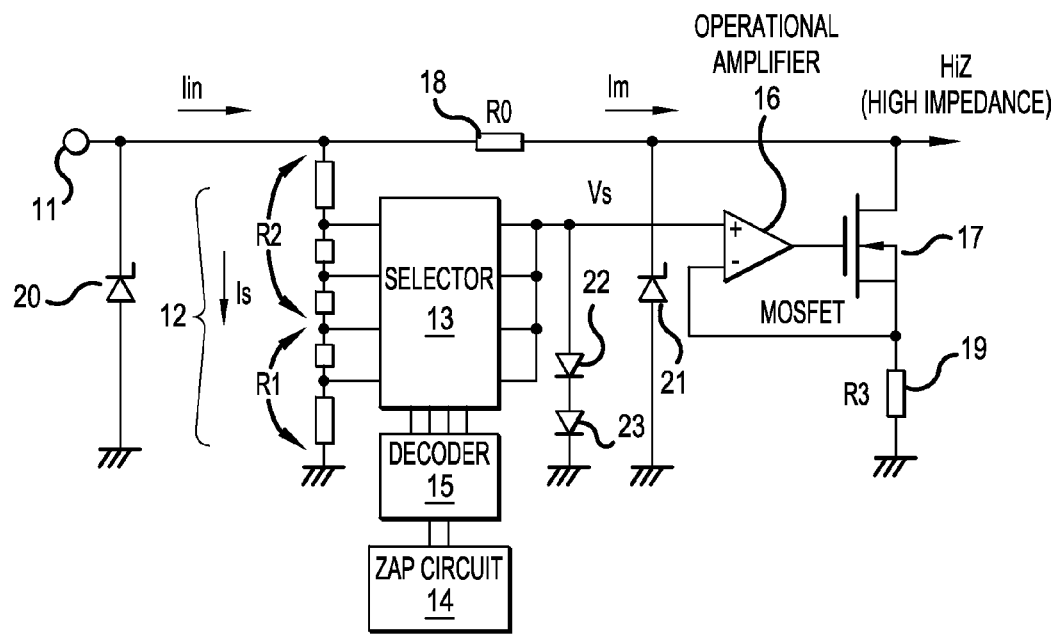
FIG. 3 shows a construction of an input circuit according to Embodiment Example 2 of the present invention.

FIG. 3 shows a construction of an input circuit according to Embodiment Example 2 of the present invention. This circuit differs from the input circuit according to Embodiment Example 1 shown in FIG. 1 in that clamping diodes 22 and 23 are connected between the output of the selector 13 and the base potential, the ground potential. The clamping diodes 22 and 23 clamp the output voltage Vs of the selector 13 at a forward voltage (or a drift voltage) of the diodes. Even if an input voltage higher than the clamping voltage is applied, the current is controlled within the value corresponding to the clamping voltage. The number of clamping diodes is determined corresponding to the necessary clamping voltage.

Figure 4:
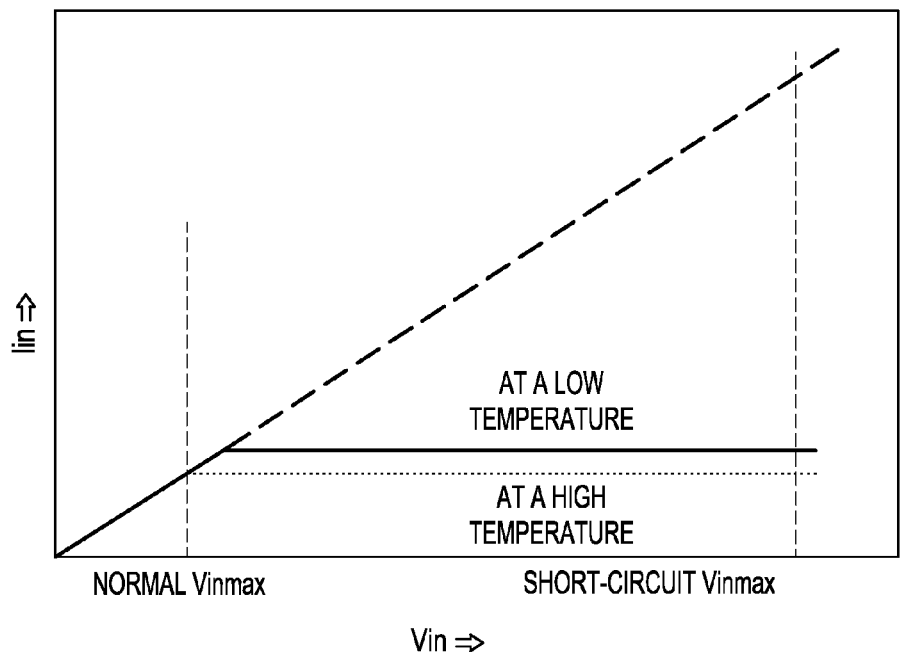
FIG. 4 shows a relationship between input voltage and input current in the input circuit according to Embodiment Example 2 of the present invention.

FIG. 4 shows a relationship between input voltage Vin and input current Iin in the input circuit according to Embodiment Example 2 of the present invention. The current is controlled at a certain constant value for input voltages higher than a specified value. In Embodiment Example 2 as shown in FIG. 4, the limiting current value does not depend on the ratio of gate width W/gate length L of the MOSFET 17 in the region of sufficiently large W/L, which enables easy design work. The current value corresponding to an input voltage in the range over the linearity region can be held smaller than in Embodiment Example 1, thereby reducing the heat generated in an event of power source short-circuiting.

The limiting current value depends on the number of stages of the clamping diodes 22 and 23, and also depends on the magnitude of the resistance of the current detecting resistor (R3) 19. Thus, the limiting current value can be set continuously, not only at discrete values. Because the forward voltage of the clamping diode decreases at high temperatures, the limiting current value when a high input voltage is applied decreases at high temperatures. However, the virtual input resistance value is not affected in the normal input voltage range.

[Embodiment Example 3]

Figure 5:
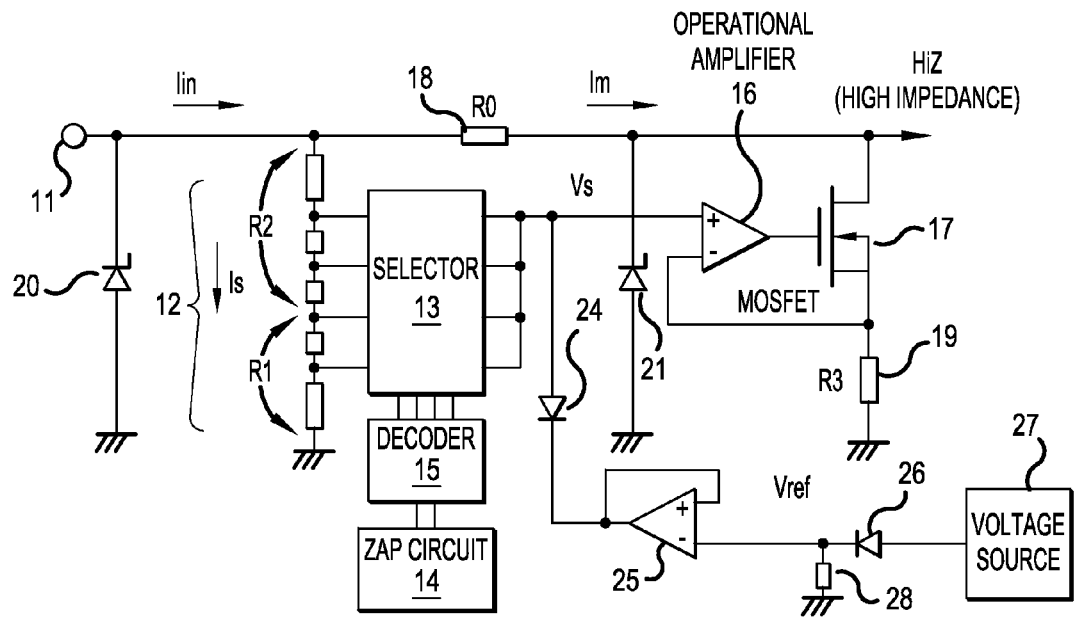
FIG. 5 shows a construction of an input circuit according to Embodiment Example 3 of the present invention.

FIG. 5 shows a construction of an input circuit according to Embodiment Example 3 of the present invention. This input circuit differs from the input circuit according to Embodiment Example 2 as shown in FIG. 3 in that the output voltage Vs of the selector 13 is connected through a reverse current preventing diode 24 to the output terminal of a voltage follower 25, and the input of the voltage follower 25 is connected through a temperature dependence compensating diode 26 to a voltage source 27. A resistance 28 is provided to establish a forward voltage (a drift voltage) of the temperature dependence compensating diode 26 by supplying a feeble current through the temperature dependence compensating diode 26.

The reverse current preventing diode 24 is provided for preventing the output Vs of the selector 13 from rising when the electric potential of the reference power supply is higher than the input voltage Vin in the relatively low voltage region of the input voltage. Because the reverse current preventing diode 24 has temperature dependence like the clamping diodes 22 and 23 in Embodiment Example 2, the temperature dependence compensating diode 26 makes correction. The voltage source 27 here, is assumed to exhibit no temperature dependence. However if the voltage sources 27 has the temperature dependence that compensates for the temperature dependence of the forward voltage of the reverse current preventing diode 24, the reference voltage source can be directly connected to the input of the voltage follower.

When the reference power supply including the voltage source 27, the temperature dependence compensating diode 26, and the resistor 28 has a low output impedance, the reference power supply can be directly connected to the reverse current preventing diode 24 eliminating the voltage follower 25.

Figure 6:
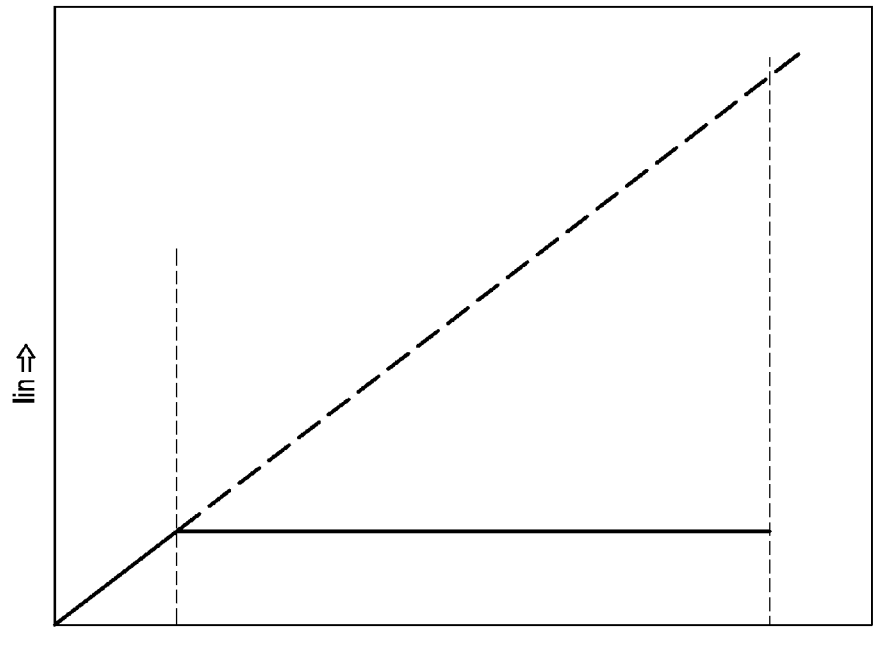
FIG. 6 shows a relationship between input voltage and input current in the input circuit according to Embodiment Example 3 of the present invention.
Figure 7:
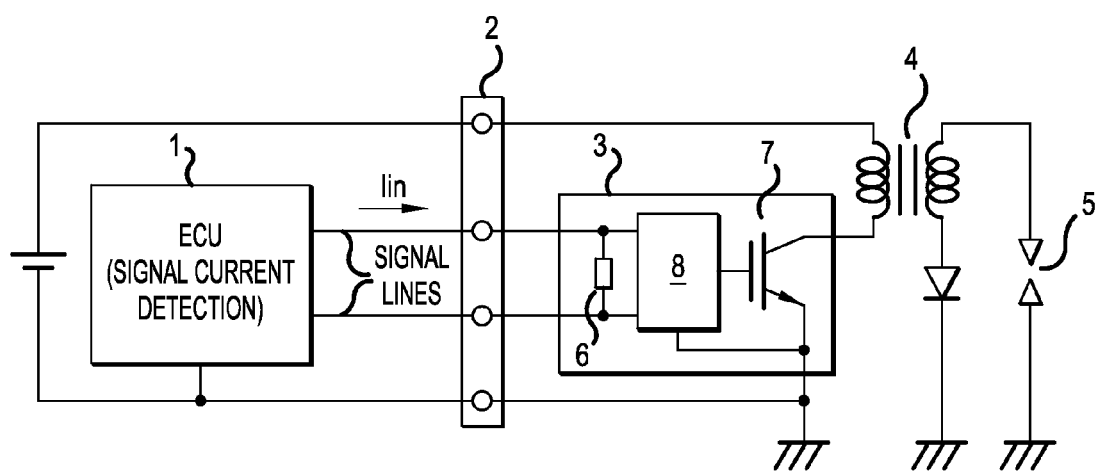
FIG. 7 shows an example of connection construction of a conventional igniter.

FIG. 6 shows a relationship between input voltage Vin and input current Iin in an input circuit according to Embodiment Example 3 of the present invention. The relationship of FIG. 6 differs from the one in Embodiment Example 3 shown in FIG. 4 in that the limiting current value becomes a certain constant value irrespective of temperature just after exceeding the normal input voltage range.

What is claimed is:

1. An input circuit comprising:
    an input voltage detecting circuit that is connected to an input terminal, detects and input voltage, and delivers a detected voltage; and
    a constant current circuit that is connected to the input terminal and generates electric current flow corresponding to the detected voltage, wherein the generated electric current flow is proportional to the input voltage over a predetermined temperature range,
    wherein the input voltage detecting circuit is a dividing resistor, and
    wherein the constant current circuit comprises:
        a MOSFET,
        a current detecting resistor connected between a source of the MOSFET and a base potential,
        an operational amplifier, a non-inverting input terminal of the operational amplifier being connected to a divided output of the dividing resistor, an inverting input terminal of the operational amplifier being connected to a source of the MOSFET, and an output terminal of the operational amplifier being connected to a gate of the MOSFET; and
    a drain of the MOSFET is connected to the input terminal.

2. The input circuit according to claim 1, further comprising a correcting circuit for correcting a dividing ratio of the dividing resistor to compensate scattering in resistance values of the dividing resistor and the current detecting resistor.

3. The input circuit according to claim 2, wherein
    the correcting circuit comprises a zap circuit and a selecting circuit that changes-over a detecting position of the dividing resistor corresponding to an output of the zap circuit, and a non-inverting input of the operational amplifier is connected to an output of the selecting circuit.

4. The input circuit according to claim 1, further comprising a surge voltage protecting resistor connected between a drain of the MOSFET and the input terminal, and a surge voltage protecting circuit connected between at least one of terminals of the surge voltage protecting resistor and the base potential.

5. The input circuit according to claim 1, further comprising a clamping circuit for clamping the non-inverting input of the operational amplifier.

6. The input circuit according to claim 2, further comprising a clamping circuit for clamping the non-inverting input of the operational amplifier, wherein the clamping circuit is composed of at least one diode that is connected between an output of the correcting circuit and the base potential and clamps the output with a forward voltage of the diode.

7. The input circuit according to claim 5, wherein the clamping circuit is composed of at least one reverse current preventing diode that is connected between the non-inverting input of the operational amplifier and an output of a voltage follower circuit, an input of which is connected to a reference power supply.

8. The input circuit according to claim 7, wherein the reference power supply comprises a temperature-independent voltage source, a compensating diode for compensating temperature-dependence of a forward voltage of the reverse current preventing diode, and a resistor for supplying a current to the compensating diode.

* * * * *